United States Patent [19]

Munk et al.

[11] Patent Number: 4,916,907
[45] Date of Patent: Apr. 17, 1990

[54] MAGNETOCALORIC MONOSTABLE AND BISTABLE INDUCTORS FOR ELECTRICAL ENERGY AND REFRIGERATION

[76] Inventors: Heinz Munk, Ulrichst. 18, 8881 Hausheim; Hans W. Stephan, Reiche Gasse 8, 8886 Wittislingen, both of Fed. Rep. of Germany

[21] Appl. No.: 249,406

[22] Filed: Sep. 26, 1988

[30] Foreign Application Priority Data

Sep. 25, 1987 [DE] Fed. Rep. of Germany ....... 3732312
Jan. 5, 1988 [DE] Fed. Rep. of Germany ....... 3800098
Jul. 20, 1988 [EP] European Pat. Off. ........ 88111642.0

[51] Int. Cl.⁴ ............................................. F25D 21/00
[52] U.S. Cl. ...................................................... 62/3.1
[58] Field of Search ................................... 62/3.1, 3.3

[56] References Cited

U.S. PATENT DOCUMENTS

| | | | |
|---|---|---|---|
| 4,107,935 | 8/1978 | Steyert, Jr. | 62/3.1 |
| 4,112,699 | 9/1978 | Hudson, III et al. | 62/3.1 |
| 4,332,135 | 6/1982 | Barclay et al. | 62/3.1 |
| 4,408,463 | 10/1983 | Barclay | 62/3.1 |
| 4,554,790 | 11/1985 | Nakagome et al. | 62/3.1 |
| 4,599,866 | 7/1986 | Nakagome et al. | 62/3.1 |
| 4,674,288 | 6/1987 | Kuriyama et al. | 62/3.3 |
| 4,727,721 | 3/1988 | Peschka et al. | 62/3.1 |
| 4,727,722 | 3/1988 | Kirol | 62/3.1 |
| 4,735,053 | 4/1988 | Carpetis | 62/3.1 X |
| 4,785,636 | 11/1988 | Hakuraku et al. | 62/3.3 |

Primary Examiner—Lloyd L. King
Attorney, Agent, or Firm—Toren, McGeady & Associates

[57] ABSTRACT

A magnetocaloric inductor circuit operates either as a monostable or bi-stable device. Mirror symmetrical permanent magnets each include first and second poles. A pole shoe is connected to the first pole of each magnet. A control core with control coil is connected between the pole shoes. The opposite poles of the first and second permanent magnets are either connected to each other by a shunt or a second set of pole shoes with their own control core. A monocrystalline metamagnetic disk is connected to an end of each pole shoe or shunt. Yoke cores are connected between the disks for each permanent magnet. An induction coil is engaged around each yoke core. A leakage flux compensation core is also connected between the ends of the yoke core for accommodating leakage flux. By controlling the current through the control coil, the field intensity at the metamagnetic disk can be altered. The metamagnetic disks have a characteristic threshold field intensity above which they become ferromagnetically conductive. Below this threshold, the disks are non-ferromagnetically conductive. Current can thus be controlled through the induction coils of the yoke cores by utilizing a smaller control current through the control cores. Each time the magnetic condition of the disks changes, heat is absorbed from the ambient. In this way the apparatus both operates to convert electrical and magnetic energy and to produce a cooling effect.

20 Claims, 5 Drawing Sheets

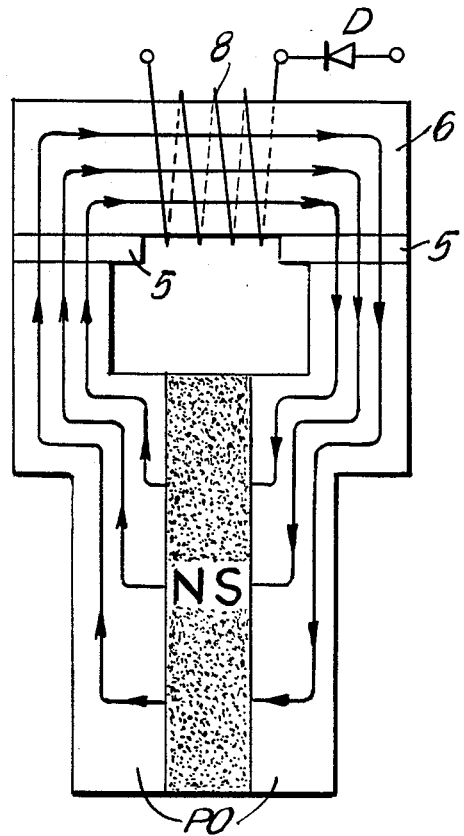
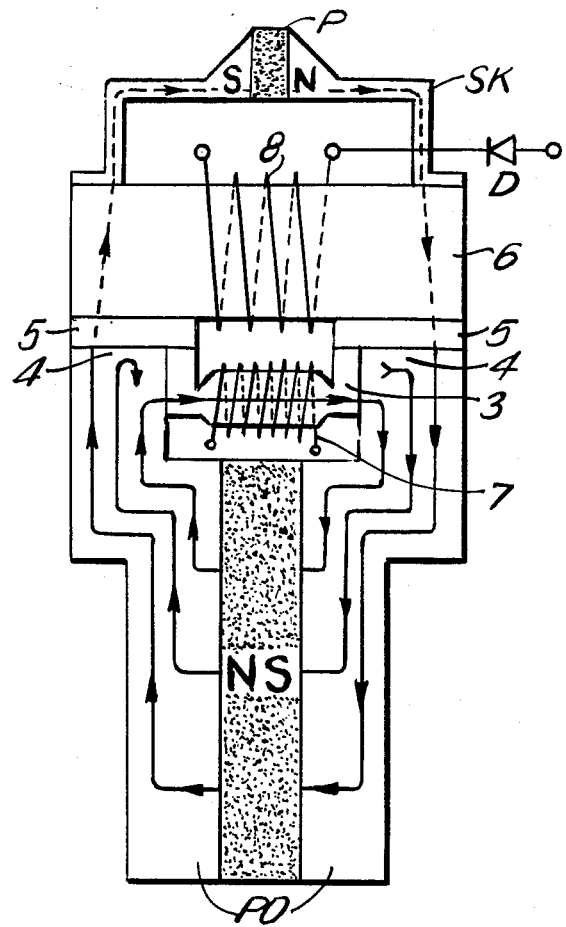
FIG. 10a      FIG. 10b
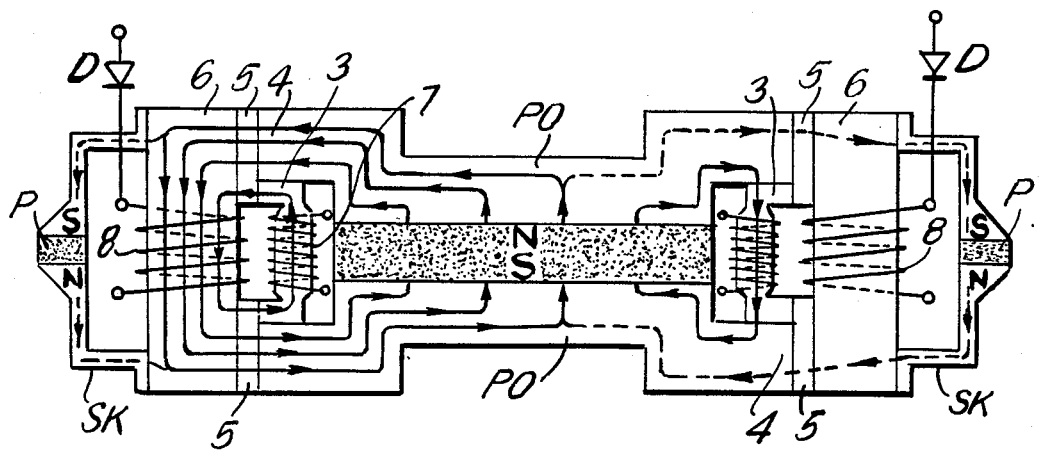
FIG. 11

MAGNETOCALORIC MONOSTABLE AND BISTABLE INDUCTORS FOR ELECTRICAL ENERGY AND REFRIGERATION

BACKGROUND OF THE INVENTION

1. FIELD OF THE INVENTION

The present invention relates, in general, to magnetocaloric equipment, and particular, to a new and useful magnetocaloric device which is capable of inducing electrical power and producing a refrigeration effect.

The magnetocaloric effect, or its reverse, has up until now only been used to achieve very low temperatures that are close to absolute zero.

Magnetocaloric energy conversion opens up fantastic possibilities if one considers that it can utilize or convert omni-present energy, namely, the environmental heat from air, water and earth, right down to the heat occurrences in polar regions, i.e., down to minus 100° C., into electrical energy, and this is permanently available around the clock. Such low temperature conversion is only possible, however, with the aid of materials which display extraordinary magnetocaloric and caloric properties, in particular, magnetic circuits.

In the present invention, the physical property is utilized wherein certain materials, in particular, monocrystalline metamagnetic materials, suddenly become ferromagnetically conductive once their critical threshold field intensity has been exceeded. Once the field intensity falls slightly below this critical threshold, these materials just as suddenly return to their antiferromagnetic state. They are thus "ideal magnetic switches".

These alterations in the magnetic state, or phase transitions of metamagnetic materials, are accompanied by, and connected with, distinctive magnetocaloric effects. Sources: *Zeitschrift fur angewandte Physik*, April 1962, Heft 4, Prof. Eckhart Vogt, Phys. -Institut Universität Marburg "Metamagnetismus"; and *Fiz. Tverd. Tela* (Leningrad) 21, 2808–2810 (Sept. 1979) S. A. Nikitin, A. S. Andreenko and V. A. Pronin, "Magnetocaloric effect and magnetic phase transitions in a dysprosium single crystal".

SUMMARY OF THE INVENTION

The present invention is based on the concept of finding an effective physical magnetic switch for a magnetic circuit arrangement which, just as a thyristor or transistor, as a switch in a d.c. circuit displays a great difference between control-switching and much larger switched electrical energy in a magnetic analog, is able to switch a much greater magnetic energy through a much smaller electromagnetic control energy. This can then be inductively coupled out of the magnetic circuit in the form of electrical energy, and the resulting magnetocaloric energy deficit arising in the metamagneticum arranged in the magnetic circuit balanced out through the introduction of low-temperature heat.

Up until the present, no usable way has been found of converting low-temperature heat directly or indirectly into electrical energy, since a simple "mechanical conversion" is impossible according to the 2nd main theorem of thermodynamics.

According to the present invention, a magnetocaloric inductor apparatus comprising at least one main permanent magnet having opposite poles, at least one dynamo pole shoe connected to one pole of the main magnet for receiving lines of magnetic flux therefrom, flux return means connected to the other pole of the main magnet for returning lines of flux thereto, a first monocrystalline metamagnetic disk connected to the shoe, a second monocrystalline metamagnetic disk connected to the flux return means, said first and second disks becoming theromagnetically conductive above a characteristic threshold field intensity and non-conductive below the threshold field intensity, a yoke core connected between the first and second disks, an induction coil connected to the yoke core, a control core operatively connected between at least one pole of the main magnet and the shoe for diverting lines of flux from the yoke core over the control core, a control coil connected to the control core for receiving current to control the diversion of lines of flux over the control core, and at least one leakage flux compensation core with an auxiliary permanent magnet connected across the yoke core for receiving leakage flux across the yoke core.

The present invention provides a feasible possibility of realizing low-temperature conversion since very slight electromagnetic control fields and flows are sufficient for the physico-magnetic switching processes in the conversion range of the critical threshold field intensity in order to switch on and off, the much greater magnetic fields and flows of a magnetic circuit, through which, compared to the control output, a much greater electrical output is induced in the induction coils of the metamagnetically disconnected magnetic circuit core sections, which has a magnetocaloric cooling effect on the metamagneticum.

The various features of novelty which characterize the invention are pointed out with particularly in the claims annexed to and forming a part of this disclosure. For a better understanding of the invention, its operating advantages and specific objects attained for its use, reference should be had to the drawings and descriptive matter in which there are illustrated and described preferred embodiments of the invention.

BRIEF DESCRIPTION OF THE DRAWINGS:

In the drawings:

FIG. 5 is a partial perspective view of a technical construction for the invention in accordance with FIG. 1a;

FIGS. 10a and 10b are schematic views of monostable inductors in accordance with the invention in a single-phase construction; and FIG. 11 is a schematic view of a push-pull construction of the invention.

Figure 1A:
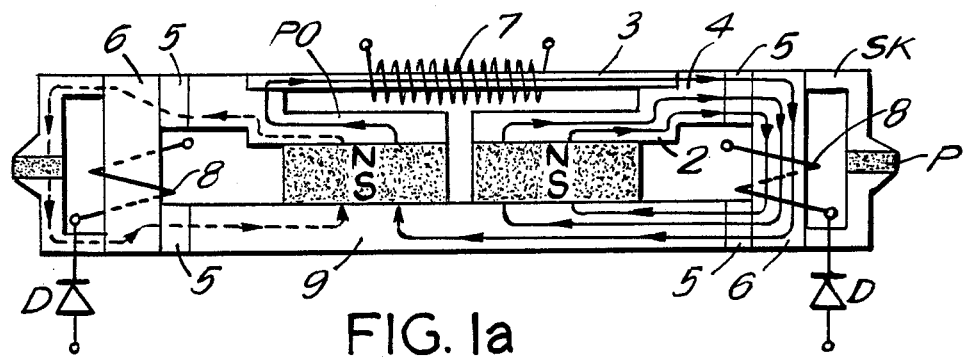
FIGS. 1a and 1b are schematic views of bistable inductors or magnetic flip-flops, in accordance with the invention, with illustrated electric flux and antiferromagnetic leakage flux compensation.
Figure 1B:
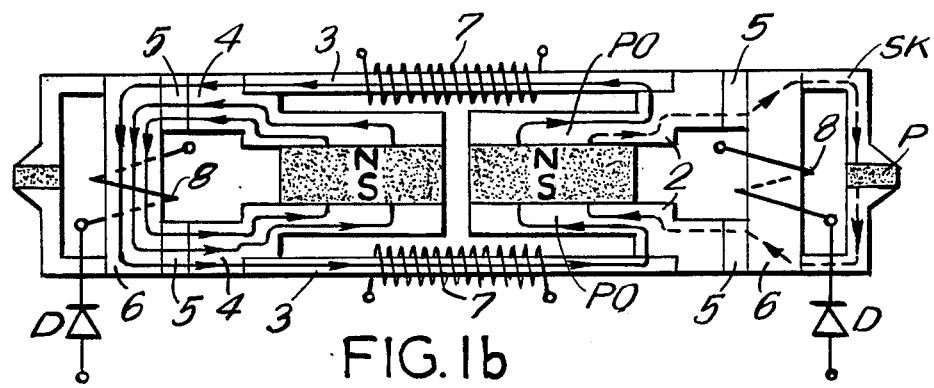

DESCRIPTION OF THE PREFERRED EMBODIMENTS:

FIGS. 1a and 1b each diagrammatically show circuit structures having two mirror-inverted identical magnetic circuits with permanent magnets N-S, dynamo sheet pole shoes PO, metamagnetic disks 5, dynamo sheet yoke cores 6, 6 with induction coils 8, 8 and leakage flux compensation cores SK with small permanent magnets P.

Both magnetic circuits in FIG. 1a are only connected to one another by a control core 3 with control coil 7, on one side, with one magnetically analogous magnetic pole shoe PO, and on the other side by a shunt 9. Shunt 9 acts as flux return means for returning lines of magnetic flux to the pole of magnet N-S for which shunt 9 is connected.

In FIG. 1b, however, both magnetic circuits are only connected to one another by the control cores 3, each with magnetically analogous pole shoes PO, naturally with one control coil 7 each, wound around core 3. In this case, the second shoe PO acts as the flux return means. The core cross-section in section 4 of the pole shoe PO corresponds to the addition of the pole cross-section in its section 2 with the control core cross-section 3. This means that the field intensity of each permanent magnet N-S in its own core section 4 of its magnetic circuit, is not sufficient to surmount the metamagnetic critical threshold or switch field intensity barrier of its disk stack 5, 5 without the additional magnetic flow through the control core 3. If a surge of current is now conducted through the control coil 7 in FIG. 1a, as the control core 3 becomes an electromagnet, the field intensity would be increased in one of the two pole shoe sections 4, depending on the direction of polarity, above the critical or switch field intensity of the neighboring disk stack 5, 5. One of the disks 5, 5 would thus become ferromagnetically conductive and the corresponding yoke core 6, 6 would become magnetized.

Diode D ensures that during this magnetization of a yoke core 6, none of the induction current which hinders the metamagnetic switch processes can flow into coil 8, which, according to Lens' law, would otherwise oppose the magnetization field with an analogous opposing field.

The function of diode D can be carried out by a thyristor, which can be turned on with the trailing edges of the control pulses. A surge with opposite polarity in control core 7 has the result that the threshold or switch field intensity of the metamagnetic disks 5, which are only just ferromagnetically conductive, is not reached and at the same time that of the opposite disk 5 of the other magnetic circuit, is exceeded.

Thus, the other yoke core 6 is magnetized, and the metamagnetically disconnected yoke core 6 is demagnetized. Each current pulse which is directionally opposite to the previous pulse in core or cores 7 in FIGS. 1a and 1b, thus flips both yoke cores 6, 6 of the magnetic circuits over to the opposite magnetic status. These are thus bistable magnetic systems or, in electronic terminology, "flip-flops".

Since much less electrical energy is required for the short switching current pulses through control coils 7, with their smaller control core 3, as compared to the cross-section of yoke cores 6, than can be coupled out of the induction coils 8 during the demagnetization phases of yoke cores 6 through diode D or turned on thyristors, a magnetocaloric lack of energy occurs in the metamagnetic disks 5, which cause an interruption of the strong magnetic flow, and this lack of energy corresponds to the amount of electrical induction energy drawn out of the yoke cores 6, 6. The metamagnetic disks 5, 5 experience a corresponding cooling which, in order to prevent a drift of the critical field intensity threshold towards lower values, has to be opposed by an equivalent supply of heat. The harmful magnetic leakage fluxes which appear in the anti-ferromagnetic switching status of the disks 5, 5 are compensated by the leakage flux compensation cores SK so as to prevent a premagnetization and insufficient demagnetization of the yoke cores 6, 6. The leakage flux compensation cores SK are designed in their cross-section in such a way that they are already magnetically saturated with the leakage flux so that the magnetizing bounce during magnetization fully benefits the yoke cores 6, 6. The leakage flux compensation cores SK can also consist of solid soft iron because of its constant magnetic flow.

Figure 2A:
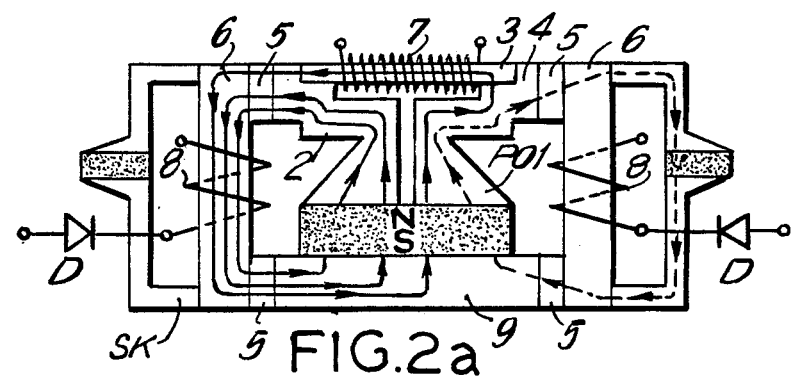
FIGS. 2a and 2b are schematic views of bistable inductors in accordance with the invention, with field and flux concentration core parts and with electric flux and antiferromagnetic leakage flux compensation illustrated.
Figure 2B:
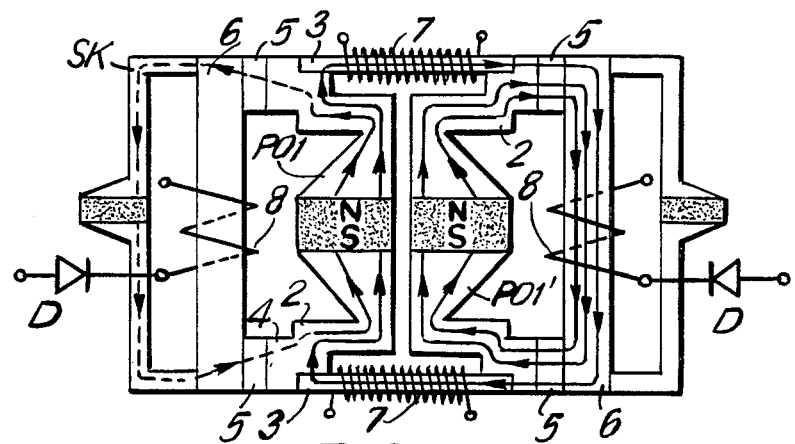

FIGS. 2a and 2b corresponds in method exactly to FIGS. 1a and 1b. The only difference is that through the use of permanent magnetic N-S with a lower flux density, the dynamo sheet pole shoes PO1 and PO1 taper in their field densities from their magnetic pole faces to the core sections 2.

Figure 3:
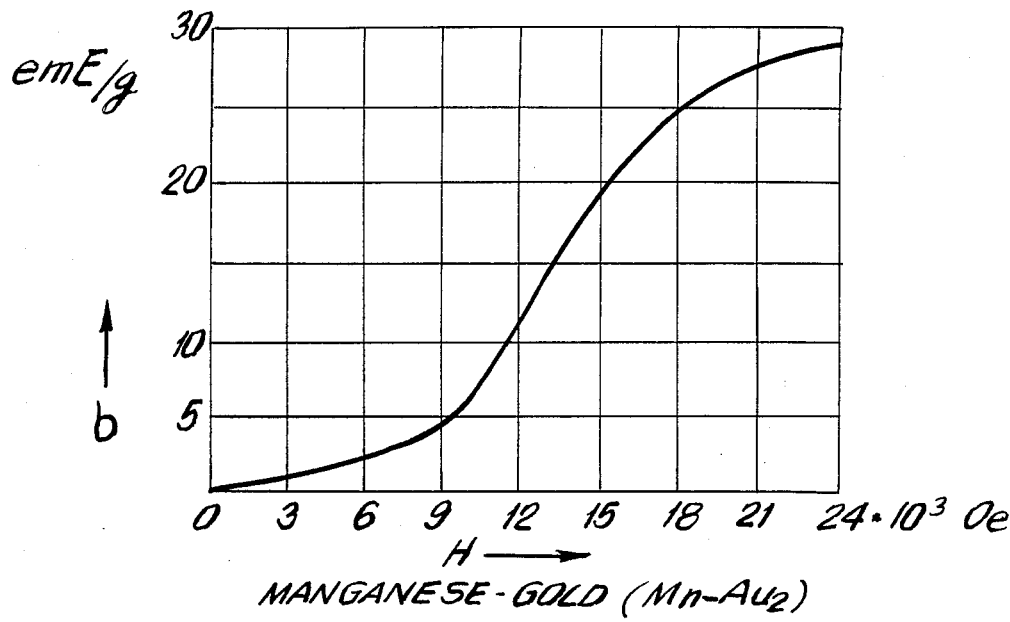
FIG. 3 is a magnetization curve of the metamagnetic polycrystalline manganese-gold alloy Mn-Au$_2$.

FIG. 3 shows the magnetization curve at temperatures between 20° C.–40° C. of the polycrystalline metamagnetic manganese-gold alloy Mn-Au$_2$, which displays too flat a magnetization rise after the critical threshold field intensity has been exceeded because of its random crystalline orientation. Thus, for use in accordance with the invention, monocrystals of this alloy would have to be manufactured, and should this prove impossible a comminution of the natural polycrystalline alloy and alignment of the resulting small monocrystallines in the magnetic field with subsequent compressions and compacting could provide a remedy.

Figure 4:
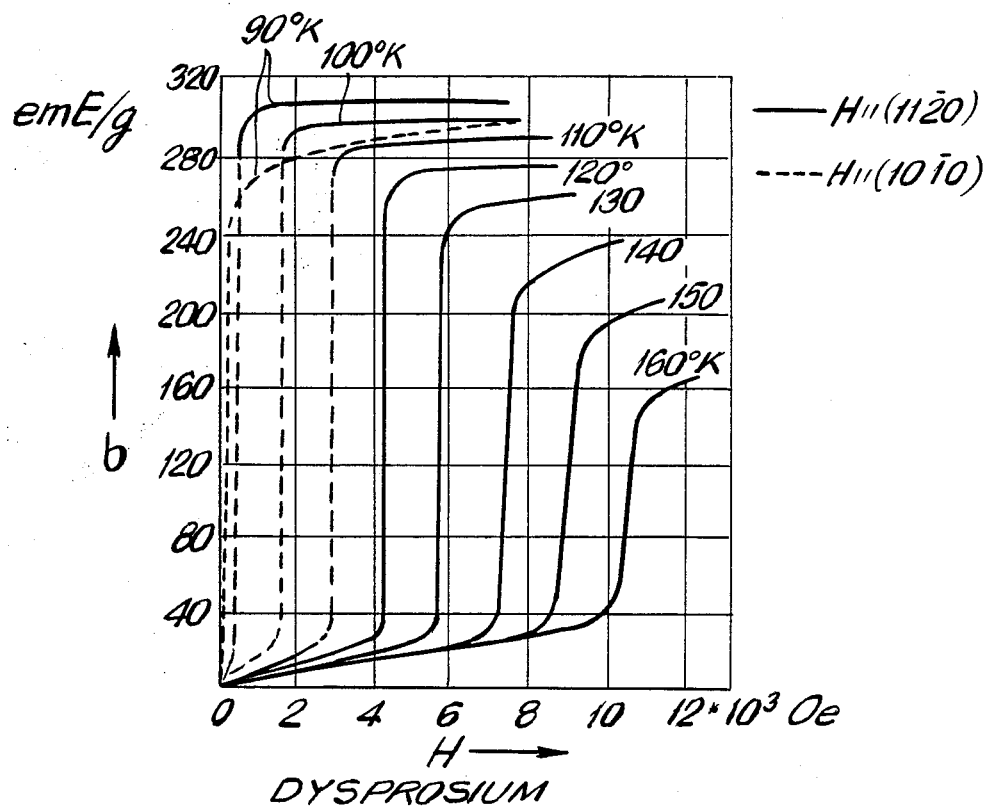
FIG. 4 is a magnetization curves of monocrystalline dysprosium, a rare earth metal.

FIG. 4 shows the magnetization curves at different magnetic transition temperatures and corresponding critical threshold field intensities for the metamagnetic rare earth metal dysprosium. These ideal magnetization curves of almost vertical gradient were measured on a cultivated dysprosium monocrystal. Although it is metamagnetic only at relatively low temperatures, this not-so-rare metal should be the preferred material for disks 5, 5 of the invention because of its high magnetization value in a ferromagnetic state and still low price.

The low functional temperature of dysprosium is also no disadvantage since the inductors themselves are high-performance cooling aggregates, and as long as electrical output is required from them, they maintain their low working temperature. On the contrary, a sufficient amount of heat must be fed into their circulation medium via a heat exchanger. Their liquid or gaseous medium cycle only has to be cooled by forced air to dysprosium's working temperature when it is started. Thus, with the magnetocaloric inductors in accordance with the invention, electrical energy and cooling can be produced simultaneously.

Figure 5:
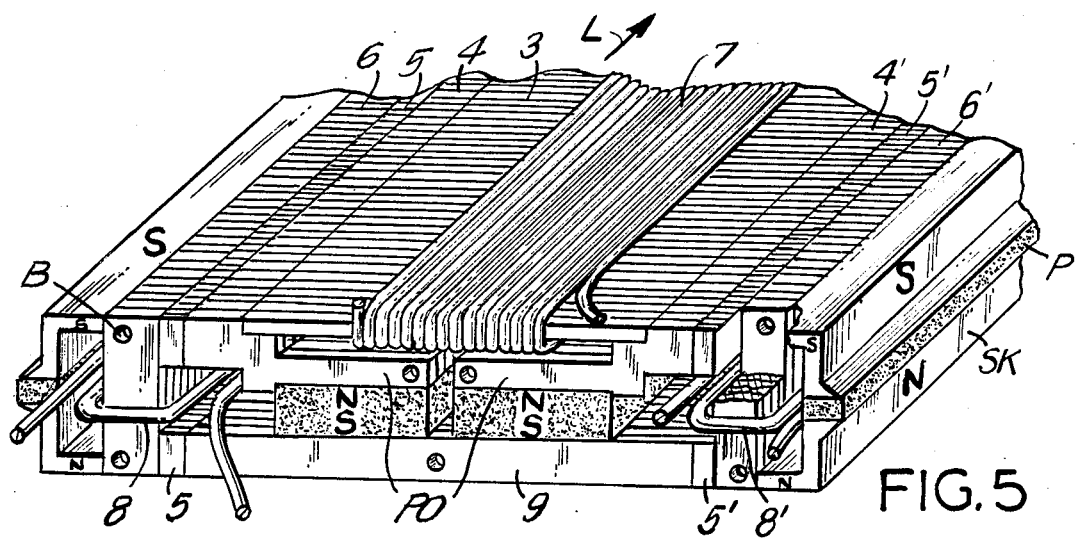

FIG. 5 is a view of a technical construction for the invention in accordance with FIG. 1a. In this view, both the yoke cores 6, and 6', as well as the pole shoes PO and shunts 9 are provided with fastening bore holes. The magnetic circuits can be realized over a relatively long distance in the direction of the arrow L, by adding sheets to the various cores.

Figure 6:
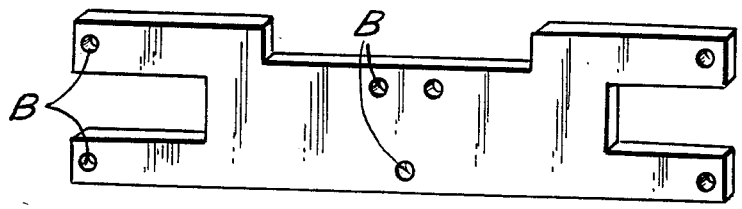
FIG. 6 is perspective view of a connecting piece for FIG. 5.

FIG. 6 is a view of a connecting piece for FIG. 5, made of Pertinax, aluminum or other non-magnetizable material, similarly provided with bore holes B, corresponding to the bore holes B in FIG. 5, in order to immovably connect the magnetic circuit components to one another by means of threaded rods, as is common also for transformers. With the long, bar-shaped constructions of FIG. 5, such connecting pieces must be repeatedly installed at intervals in order to preserve the mechanical stability and the exact distances between the separate parts of the magnetic circuit. Since the magnetic circuits cannot produce randomly large field intensities at the pole shoe and shunt core ends facing the disks 5, 5', even if strong samarium-cobalt magnets are used, and the field intensity arising at the disks 5, 5' is dependent on the width of these disks 5, 5', which forms the distance to the yoke cores 6, 6', the disk width must remain within the range of the threshold or switch field intensity value which can still be exceeded by the magnetic circuits with the aid of the control core flux.

This width of the disks 5, 5' is thus a constant for physical reasons, irrespective of the planned size of the magnetic circuits, with the same metamagnetic basic material. For this reason it is disadvantageous to manufacture particularly large magnetic circuits since in this case all components of the magnetic circuits can be increased two-dimensionally whereas the disks 5, 5' can only be enlarged one-dimensionally because of the invariable width. On the contrary, it is more practical to reduce the magnetic circuits since the widths of the disks 5, 5' remains the same and only their height is reduced, whilst the components reduce their squared superficial extent, with the exception of the expansion in the direction of the arrow L in FIG. 5.

This is an important fact, for what is the use of a large yoke core 6 6', if the disks 5, 5', which are too small in relationship to the core, and thus has too small a disk surface, cannot keep up with the possible large electrical energy output of too large a yoke core 6, 6' in its heat absorbing capacity.

With size variation continued two-dimensional, and in the case of the disks 5, 5', one-dimensional reduction of the facial square measure of the magnetic circuits, the dimension is very quickly reached whereby the possible electrical power output is in an energetic balance with the caloric absorbing capacity of the disks 5, 5' surfaces. This energetic equilibrium is naturally achieved all the quicker the more the disk surfaces can be artificially enlarged at a constant width of the disks 5, 5'.

FIGS. 7a to 7d show enlarged views of such surface enlargement possibilities for the metamagnetic disks 5, 5', in accordance with the invention.

Figure 7A:
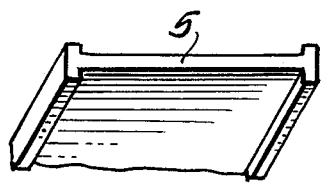
FIG. 7a, 7b, 7c and 7d are greatly enlarged views of metamagnetic disk constructions in accordance with the invention.
Figure 7B:
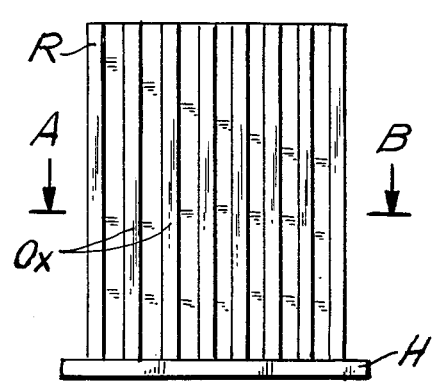
Figure 7C:
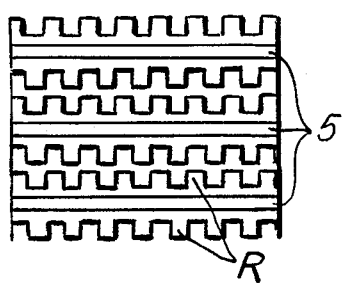
Figure 7D:
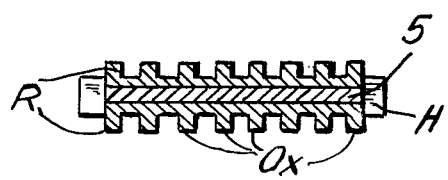

FIG. 7a is a partial perspective view of a disk 5 with reduced height and with a reduced surface. This disk can be connected together with other similar disks 5 to leave small slits open to let the medium pass through. FIG. 7b is a top view of the surface of a disk 5, which in cross-section A-B is shown in FIG. 7d. On the surface of this disk, galvanic, or by other suitable processes double-sided, good caloric conductive narrow copper or silver ribs R can be seen which have been applied by vacuum evaporation, and which serve to increase the surface area. Such ribs R can also be engraved in strips in thicker metamagnetic disks 5, or be produced by other suitable material erosion processes. The facial surfaces of the ribs R can be insulated by a coat of oxide Ox or varnish. The disks 5 may also display soldered securing rods H which extend beyond the width of the disk, or others which do not. FIG. 7c shows a frontal view of connected disks 5 with enhanced surfaces. They correspond to FIG. 7b, though the ribs, with the exception of the outer ribs, on both faces sides are arranged opposite one another in such a way that when laid together in series, each rib front side is opposite an indentation.

Figure 8:
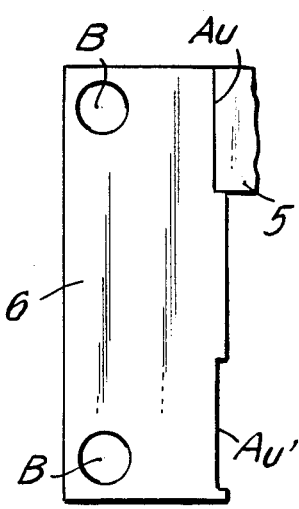
FIG. 8 is an elevational view of a single yoke-core-dynamo-sheet of the invention.

FIG. 8 shows a single yoke core sheet 6 in accordance with the invention with slight recesses of Au and Au' which serve to retain the disks 5, 5'. Similar slight recesses to prevent the disks 5, 5' from slipping in the inside of the magnetic circuit can also be seen on the front side of the pole shoe PO in the core cross-section 4.

Figure 9:
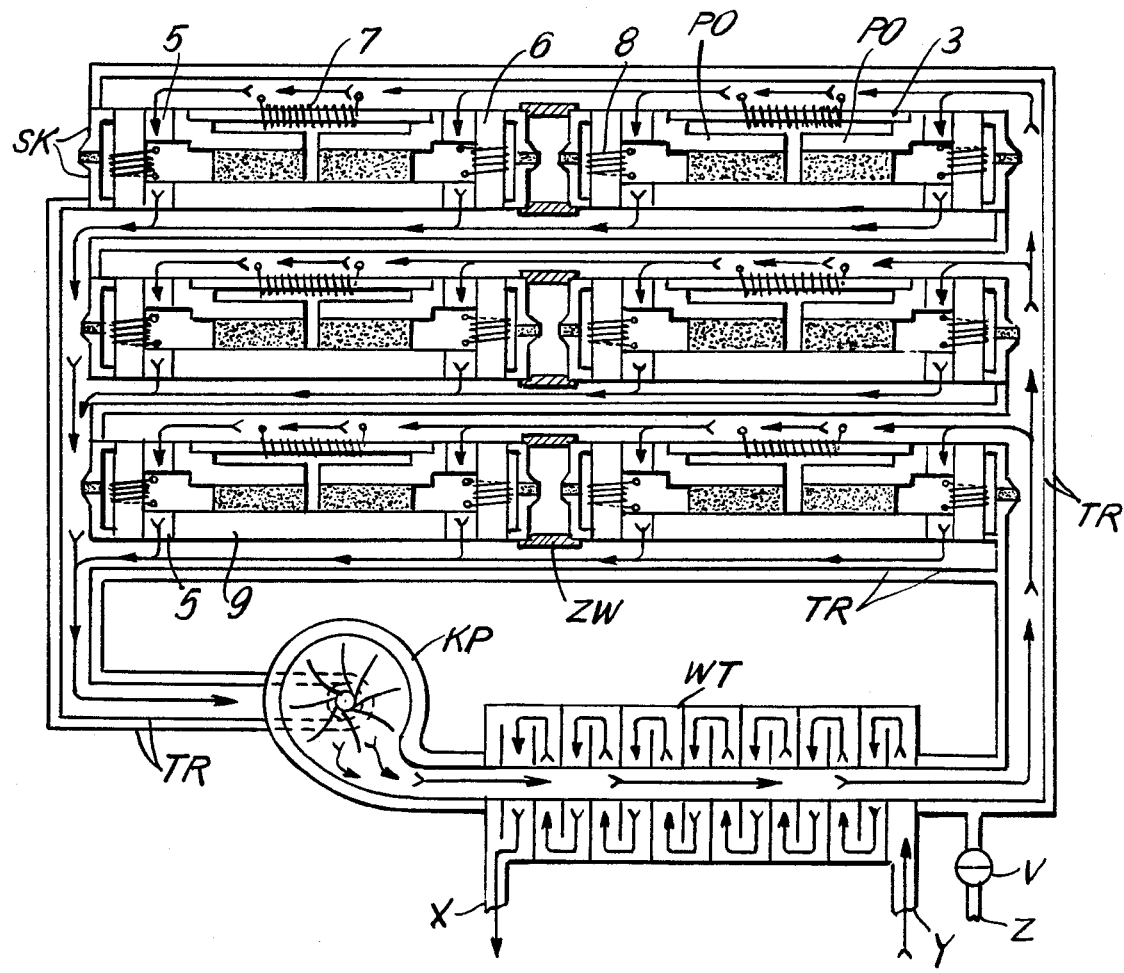
FIG. 9 is a system view showing the circulation of liquid or gaseous media through the metamagnetic disk lamina inserted into the magnetic circuits, with a larger number of magnetocaloric bistable inductors, and in connection with a heat exchanger and circulation pump.

FIG. 9 shows an arrangement of six magnetocaloric push-pull inductors in accordance with FIG. 1a and FIG. 5, which are combined in pairs by connectors ZW to from an almost complete plant to produce electrical energy and cold or cooling. A circulation pump KP conveys liquid coolant through a heat exchanger WT and in the direction of the arrow through slits in the disks 5, in a cycle back to the circulation pump KP. In order to prevent an unwanted heat penetration through the sheet steel housing in which the inductors are installed, the sheet steel housing is constructed of double-wall dividing walls TR and the space between the two walls is evacuated. A vacuum pump is connected at connection Z. In order to commence the production of electrical energy and cold, the dysprosium of disks 5, must be cooled down to its working temperature of approximately 150° K. at the start by connecting an external cooling machine at connections X and Y. Following this, it suffices to continually draw off electrical energy from the inductors so as to not only maintain the low temperature of the plant, but also to be able to draw off thermal energy from the heat exchanger WT. Furthermore, in the event of larger heat consumption, the vacuum between the dividing walls TR could also be reduced by valve V. As can also be seen in FIG. 9, the surface ratio is altered in favor of disks 5 through the two-dimensional, and for disks 5 one-dimensional graphic reduction of the magnetic circuits as compared to FIGS. 1a and 5.

FIGS. 10a and 10b show a further example for the invention as a monostable magnetocaloric inductor. The magnetic circuit in FIG. 10a, consisting of a permanent magnet N-S, dynamo sheet pole shoes PO, metamagnetic disk 5, yoke core 6 with induction coil 8 dimensioned in such a way that the field intensity affecting the disk 5 is above its threshold field intensity value. The metamagnetic disks 5 are thus switched through into the ferromagnetically conductive state. If a small dynamo sheet control core 3 with coil 7 is now inserted into the same magnetic circuit, as can be seen in FIG. 10b, part of the magnetic flux is shorted via this control core 3, as a result of which the field intensity in the pole shoe section 4 falls below the threshold field intensity value of the metamagnetic disk 5 and causes its magnetization to rebound into the antiferromagnetic state.

If the control coil 7 of the control core 3 is now fed with a surge which produces a field which works against the small magnetic derivation flux and reverses its direction of polarity, the field intensity in the pole shoe section 4 increases once again to the original high value as in FIG. 10a, above the threshold field intensity of disk 5, switches this over to its ferromagnetic status and magnetizes yoke core 6. Here, as well as the induction coil 8 cannot build up an opposing field during magnetization of the core 6 since diode D blocks this polarity.

After the control current for coil 7 has been interrupted or reversed, a magnetic part flux is once again shorted over control core 3 and disks 5 switch back to their statically preferred antiferromagnetic state. The induction coil 8 naturally tries to maintain the condition of magnetic saturation after its core 6 has been magnetized, in accordance with Lenz's law, if its yoke core 6 wants to demagnetize as a result of the switch-off process. However, the coil 8 can only delay the magnetization rebound of disks 5 into their monostable preferred antiferromagnetic state since its retaining field, generated by the induction current, is in the end only fed by the continuous field alteration toward a further demagnetization of its core.

This is similar to a dynamo. The more current is consumed, the more it is braked. This inhibited magnetization rebound of the metamagneticum as a result of the power consumption of a connected consumer thermal energy and must be compensated by the circulation medium in order to prevent a drift of the threshold field intensity value as a result of cooling.

FIG. 11 shows an arrangement of two monostable magnetoelectric inductors in accordance with FIG. 10b, as a push-pull circuit.

The pole shoes PO of these monostable inductors can also naturally be provided with field-condensing core parts PO1, in accordance with FIG. 2a and 2b, which, starting from the magnet pole faces, taper down in their cross-sections to the core section 4, or to the joining control core 3.

While specific embodiments of the invention have been shown and described in detail to illustrate the application of the inventive principles, it will be understood that the invention may be embodied otherwise without departing from such principles.

What is claimed is:

1. A magnetocaloric inductor apparatus for inducing electrical power and for producing a cooling effect, comprising:
   at least one main permanent magnet having opposite poles;
   at least one dynamo pole shoe connected to one pole of said main magnet for receiving lines of magnetic flux;
   flux return means connected to the other pole of said main magnet for returning lines of flux thereto;
   a first monocrystalline metamagnetic disk connected to said shoe;
   a second monocrystalline magnetic disc connected to said flux return means;
   said first and second disks becoming ferromagnetically inductive above a characteristic threshold field intensity and non-conductive below the threshold field intensity;
   a yoke core connected between said first and second disk;
   an induction coil connected to said yoke core for receiving induced current due to the passage of lines of magnetic flux through said yoke core;
   a control core operatively connected between at least one of the poles of said main magnet and said shoe for diverting lines of flux from said yoke core;
   a control coil connected to said control core for receiving control current to determine the amount of flux diverted from said yoke core through said control core for controlling the field intensity at said first and second disks to control ferromagnetic conductivity thereof; and
   at least one leakage flux compensation core connected across said yoke core for receiving leakage magnetic flux across said yoke core.

2. An apparatus according to claim 1, wherein said flux return means comprises a second dynamo pole shoe connected to the other pole of said main magnet, said control core being tightly connected between said first mentioned and second pole shoes and being dimensioned so as to reduce the threshold field intensity available at said first and second disks to below the characteristic threshold field intensity, said control coil receiving the control current for counteracting lines of flux through said control core to increase the threshold field intensity available at said first and second disks to above said characteristic threshold field intensity, said apparatus thus comprising a monostable inductor apparatus.

3. An apparatus according to claim 1, including a further permanent magnet, pole shoe, flux return means, first and second metamagnetic disks, yoke core with induction coil and leakage flux compensation core connected in mirror symmetry to said first mentioned permanent magnet, pole shoe, flux return means, first and second metamagnetic disks, yoke core with induction coil and leakage flux compensation core, for forming a bi-stable inductor apparatus, said control core with control coil being connected between said first mentioned pole shoe and said further pole shoe and said first mentioned and further flux return means being connected to each other.

4. An apparatus according to claim 3, wherein said first mentioned and further flux return means comprise a single shunt connected to the other pole of each said first mentioned and second main permanent magnets, said shunt connected to the second metamagnetic disk of each of said first mentioned and second yoke cores.

5. An apparatus according to claim 3, wherein said first mentioned and second flux return means comprise separate second pole shoes respectively connected to the second pole of said first mentioned and second main permanent magnet, and a second control core with control coil connected thereto, connected between said second pole shoes.

6. An apparatus according to claim 1, wherein said first and second metamagnetic disks are made of material selected from the group of cultivated monocrystals of metamagnetic rare earth metals and gold-manganese alloys.

7. An apparatus according to claim 6, wherein said rare earth metals are selected from the group consisting of dysprosium and terbium.

8. An apparatus according to claim 6, wherein said gold-manganese alloy comprises $Mn-Au_2$.

9. An apparatus according to claim 6, wherein said first and second disks are fabricated by one of abrasive cutting, sawing, and mechanical working.

10. An apparatus according to claim 1, including galvanically manufactured ribs on each of said metamagnetic disks.

11. An apparatus according to claim 10, wherein said ribs are made of one of the same material as said disks, copper and silver.

12. An apparatus according to claim 1, including surface enlarging structures defined on each of said first and second metamagnetic disks produced by one of engraving, vacuum evaporation, and machining, for enlarging heat absorbing surfaces of said disks.

13. An apparatus according to claim 1, including current control means connected to said induction coil for limiting the flow of current through said induction coil to one direction of flow.

14. An apparatus according to claim 13, wherein said control means comprises a diode.

15. An apparatus according to claim 1, wherein said dynamo pole shoe has a tapered portion connected adjacent to the pole of said main magnet to which said pole shoe is connected, said pole shoe tapering inwardly in a direction away from the one pole of said main magnet and in a direction toward the point of connection between said pole shoe and said control core, for increasing the field and flux intensity near said control core as compared with the field and flux intensity near said first disk.

16. An apparatus according to claim 1, including non-magnetizable connecting pieces having bores therethrough for receiving fasteners, connected between multiple pieces making up said cores.

17. An apparatus according to claim 1, wherein at least one of said yoke core and dynamo pole shoe includes recesses for connection to said disks and holes for receiving fasteners.

18. An apparatus according to claim 1, including, in combination, heat transfer means for supplying heat transfer fluid past said first and second metamagnetic disks for being cooled by a cooling effect of said disks when said disks change magnetic state.

19. An apparatus according to claim 18, wherein said heat transfer means include a double wall conduit conveying the medium, vacuum means for evacuating a space in the double wall conduit for insulating a double wall conduit, and a medium circulation pump for circulating medium through said conduit.

20. An apparatus according to claim 19, wherein said first and second disks include channels therethrough for receiving medium for increasing a heat transfer effect between said disks ends.

* * * * *